(12) United States Patent
Akinmade-Yusuff et al.

(10) Patent No.: US 8,835,307 B2
(45) Date of Patent: Sep. 16, 2014

(54) METHOD AND STRUCTURE FOR REWORKING ANTIREFLECTIVE COATING OVER SEMICONDUCTOR SUBSTRATE

(75) Inventors: Hakeem Akinmade-Yusuff, Hopewell Junction, NY (US); John A. Fitzsimmons, Hopewell Junction, NY (US); Ranee Wai-Ling Kwong, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/468,232

(22) Filed: May 10, 2012

(65) Prior Publication Data

US 2012/0231554 A1   Sep. 13, 2012

Related U.S. Application Data

(63) Continuation of application No. 12/610,679, filed on Nov. 2, 2009, now Pat. No. 8,288,271.

(51) Int. Cl.
| | | |
|---|---|---|
| *H01L 33/44* | (2010.01) | |
| *H01L 21/311* | (2006.01) | |
| *H01L 21/027* | (2006.01) | |
| *G03F 7/42* | (2006.01) | |
| *G03F 7/09* | (2006.01) | |
| *H01L 51/00* | (2006.01) | |

(52) U.S. Cl.
CPC .... *H01L 21/31138* (2013.01); *H01L 21/31144* (2013.01); *H01L 21/0276* (2013.01); *G03F 7/422* (2013.01); *G03F 7/091* (2013.01)
USPC ........... 438/636; 438/623; 438/626; 438/699; 257/E21.029; 257/E21.234; 257/E21.037; 257/E21.587

(58) Field of Classification Search
CPC ..... H01L 21/0276; H01L 33/44; G03F 7/091; G03F 7/422
USPC ............... 438/69, 82, 99, 623, 626, 636, 669, 438/671, 699, 725, 780, 789–790, 793–794, 438/952; 257/E21.029, E21.234–E21.236, 257/E21.035–E21.039, E21.587, E21.025, 257/E21.601
See application file for complete search history.

(56) References Cited

U.S. PATENT DOCUMENTS

| | | |
|---|---|---|
| 6,475,707 B2 | 11/2002 | Yu |
| 6,998,347 B2 | 2/2006 | Hsu et al. |

(Continued)

OTHER PUBLICATIONS

U.S. Appl. No. 12/610,679, filed Nov. 2, 2009 Applicant: Hakeem Akinmade-Yusuff, et al. Office Action dated Mar. 1, 2012 with Notice of Cited References.

*Primary Examiner* — Laura Menz
*Assistant Examiner* — Maliheh Malek
(74) *Attorney, Agent, or Firm* — Yuanmin Cai

(57) ABSTRACT

A method and a structure for reworking an antireflective coating (ARC) layer over a semiconductor substrate. The method includes providing a substrate having a material layer, forming a planarization layer on the material layer, forming an organic solvent soluble layer on the planarization layer, forming an ARC layer on the organic solvent soluble layer, forming a pattern in the ARC layer, and removing the organic solvent soluble layer and the ARC layer with an organic solvent while leaving the planarization layer unremoved. The structure includes a substrate having a material layer, a planarization layer on the material layer, an organic solvent soluble layer on the planarization layer, and an ARC layer on the organic solvent soluble layer.

11 Claims, 14 Drawing Sheets

(56) References Cited

U.S. PATENT DOCUMENTS

| | | |
|---|---|---|
| 8,450,854 B2 * | 5/2013 | Lin et al. .................... 257/773 |
| 2003/0062336 A1 | 4/2003 | Restaino et al. |
| 2005/0064322 A1 * | 3/2005 | Babich et al. ............. 430/270.1 |
| 2006/0094204 A1 * | 5/2006 | Isono ........................... 438/437 |
| 2006/0110941 A1 * | 5/2006 | Yen et al. ..................... 438/781 |
| 2006/0183314 A1 * | 8/2006 | Dellaguardia et al. ....... 438/618 |
| 2007/0015082 A1 * | 1/2007 | Angelopoulos et al. ... 430/270.1 |
| 2007/0111134 A1 | 5/2007 | Ogihara et al. |
| 2007/0117411 A1 | 5/2007 | Ogihara et al. |
| 2008/0194097 A1 | 8/2008 | Kim et al. |
| 2008/0220375 A1 | 9/2008 | Kim et al. |
| 2008/0292995 A1 * | 11/2008 | Houlihan et al. ............. 430/322 |
| 2009/0061355 A1 * | 3/2009 | Angelopoulos et al. ... 430/272.1 |
| 2009/0194503 A1 * | 8/2009 | Ko et al. ........................ 216/47 |
| 2010/0243604 A1 * | 9/2010 | Lee et al. ........................ 216/67 |
| 2010/0247770 A1 * | 9/2010 | Saito et al. .................... 427/256 |
| 2011/0076845 A1 * | 3/2011 | Tsai et al. ..................... 438/618 |
| 2011/0294068 A1 * | 12/2011 | Cheng et al. ............. 430/280.1 |
| 2011/0300483 A1 * | 12/2011 | Cheng et al. ............. 430/272.1 |
| 2013/0017486 A1 * | 1/2013 | Angelopoulos et al. ... 430/272.1 |

\* cited by examiner

METHOD AND STRUCTURE FOR REWORKING ANTIREFLECTIVE COATING OVER SEMICONDUCTOR SUBSTRATE

CROSS REFERENCE TO RELATED APPLICATIONS

The present application is a continuation application of co-pending U.S. application Ser. No. 12/610,679, filed on Nov. 2, 2009, the contents of which are incorporated by reference in its entirety herein.

FIELD OF THE INVENTION

The present invention relates generally to semiconductor device processing and, more particularly, to reworking antireflective coating layers over a semiconductor substrate.

BACKGROUND OF THE INVENTION

As feature sizes continue to scale down in semiconductor industry, the fabrication process of integrated circuit devices becomes more and more complex. Advanced semiconductor designs typically incorporate multilayer structures. For example, during the process of formation of a metal interconnect, usually a hardmask layer, a planarization layer and an antireflective coating (ARC) layer are sequentially formed on a substrate with a dielectric layer thereon. A photoresist layer is then formed on top of the ARC layer. The definition of the pattern is formed by photolithography on the photoresist layer. The resist pattern is transferred to the ARC layer via an etch process using the photoresist film as a mask. Similarly, the ARC pattern is transferred sequentially through all other underlying layers, and finally, a pattern is formed on the substrate.

During the deposition or the processing of the multilayer structures, if defects or other types of errors are found in any layer of the structures, the substrate must be reworked to prevent permanent damage to the entire batch of chips in subsequent processing. In addition, selective removing the multilayer structures is often necessary for purposes of performing defect yield analysis, and/or for electrical characterization or physical failure analysis of wafers, wafer fragments, individual dies, or packaged dies to perform reliability defect root cause analysis.

Reworking multilayer structures including low-k dielectric materials is problematic using known layer removal techniques such as conventional chemical-mechanical polish (CMP), or plasma or reactive ion etch processes. The fragile nature of the low-k dielectric materials causes them to react poorly to processes effective for oxide dielectrics. In addition, conventional layer removal processes used to remove overlying layers can result in damages to the underlying low-k dielectric layers.

New and improved processes are thus desirable which can selectively rework overlying layers without damaging the underlying low-k dielectric layers on a multilayer semiconductor substrate.

SUMMARY OF THE INVENTION

The present invention provides a method and a structure for reworking an antireflective coating (ARC) layer over a semiconductor substrate without causing damage to an underlying dielectric layer.

A first embodiment introduces a method of reworking an antireflective coating (ARC) layer over a substrate. The method includes the steps of providing a substrate having a material layer; forming a planarization layer on the material layer; forming an organic solvent soluble layer on the planarization layer; forming an ARC layer on the organic solvent soluble layer; forming a pattern in the ARC layer; and removing the organic solvent soluble layer and the ARC layer with an organic solvent while leaving the planarization layer unremoved.

A second embodiment introduces a method of reworking an ARC layer over a substrate. The method includes the steps of providing a semiconductor substrate having a material layer and a hardmask layer on the material layer; forming an organic solvent soluble layer on the hardmask layer; forming a planarization layer on the organic solvent soluble layer; forming an ARC layer on the planarization layer; forming a pattern in the ARC layer; and removing the organic solvent soluble layer, the ARC layer and the planarization layer with an organic solvent.

A third embodiment introduces a method of forming a patterned material structure on a substrate. The method includes the steps of providing a substrate having a material layer; forming a planarization layer on the material layer; forming a first organic solvent soluble layer on the planarization layer; forming a first ARC layer on the first organic solvent soluble layer; forming a first pattern in the first ARC layer; removing the first organic solvent soluble layer and the first ARC layer with an organic solvent while leaving the planarization layer unremoved; forming a second organic solvent soluble layer on the planarization layer; forming a second ARC layer on the second organic solvent soluble layer; forming a second pattern in the second ARC layer; and transferring the second pattern to the material layer.

A fourth embodiment introduces a method of forming a patterned material structure on a substrate. The method includes the steps of providing a substrate having a material layer and a hardmask layer on the material layer; forming a first organic solvent soluble layer on the hardmask layer; forming a first planarization layer on the first organic solvent soluble layer; forming a first ARC layer on the first planarization layer; forming a first pattern in the first ARC layer; removing the first organic solvent soluble layer, the first ARC layer and the first planarization layer with an organic solvent leaving the hardmask layer unremoved; forming a second organic solvent soluble layer on the hardmask layer; forming a second planarization layer on the second organic solvent soluble layer; forming a second ARC layer on the second planarization layer; forming a second pattern in the second ARC layer; and transferring the second pattern to the material layer.

A fifth embodiment introduces a multilayer structure including a substrate having a material layer; a planarization layer on the material layer; an organic solvent soluble layer on the planarization layer; and an ARC layer on the organic solvent soluble layer.

A sixth embodiment introduces a multilayer structure including a semiconductor substrate having a material layer and a hardmask layer on the material layer; an organic solvent soluble layer on the hardmask layer; a planarization layer on the organic solvent soluble layer; and an ARC layer on the planarization layer.

The above described and other features are exemplified by the following figures and detailed description.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

Figure 1:
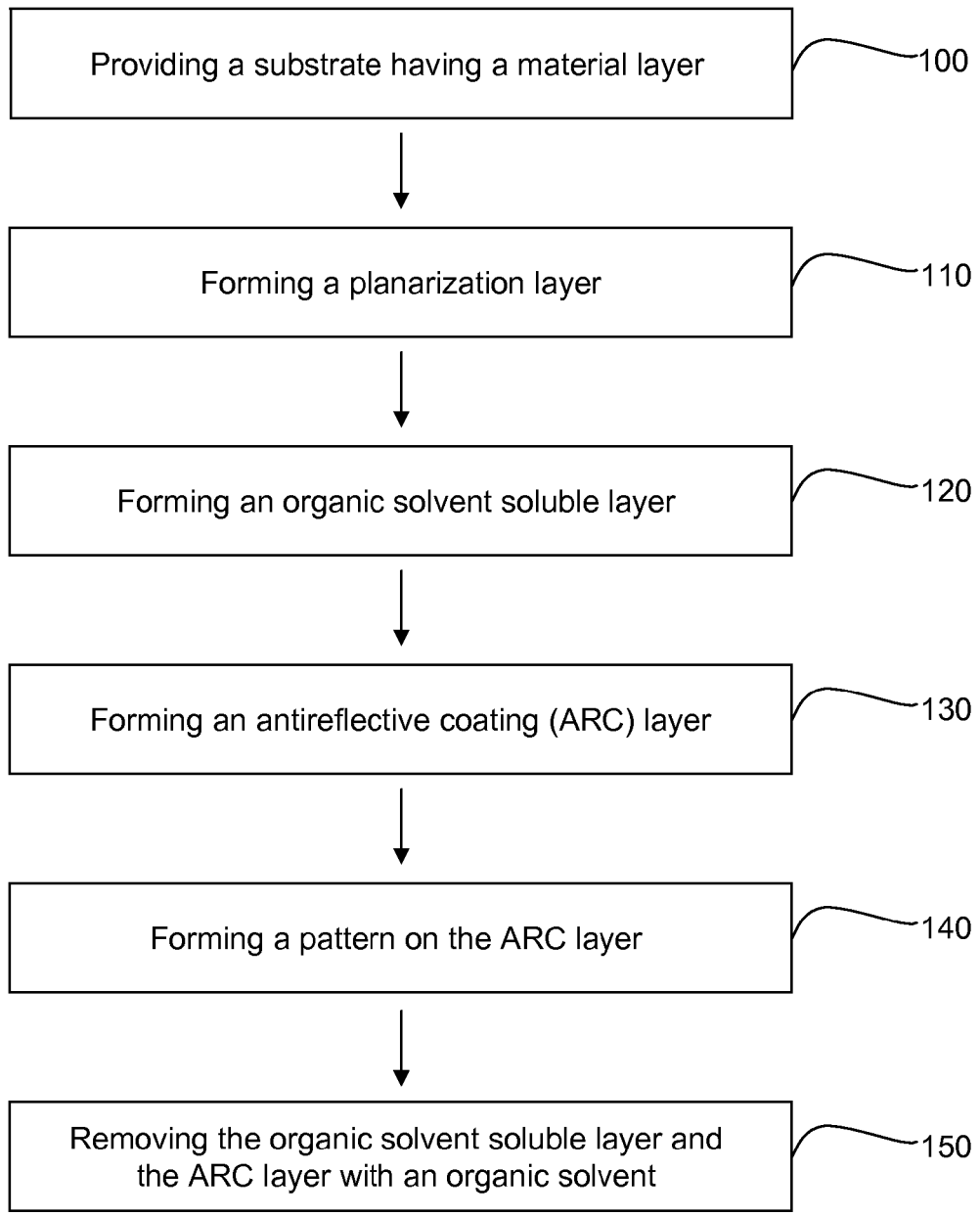
FIG. 1 is a flow chart illustrating a method of reworking an ARC layer on a substrate, in accordance with the present invention.

The present invention will now be described more fully hereinafter with reference to the accompanying drawings in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numerals refer to like features throughout. Features of the invention are not necessarily shown to scale in the drawings.

It will be understood that when an element, such as a layer, is referred to as being "on" or "over" another element, it can be directly on the other element or intervening elements may also be present. In contrast, when an element is referred to as being "directly on" or "directly over" another element, there are no intervening elements present.

The present invention provides a method and a structure for removing an ARC layer over a semiconductor substrate without causing damage to an underlying dielectric layer. In this method, the substrate has a material layer and a hardmask layer on the material layer. An organic solvent soluble layer is first formed on the hardmask layer. An ARC layer is then formed on the organic solvent soluble layer. Thereafter, a resist pattern is formed on the ARC layer. The resist pattern is transferred to the ARC layer through an etch transfer process. If defects or other types of errors are found on the ARC pattern, the organic solvent soluble layer can be removed by using an organic solvent thereby releasing the ARC layer on top of the organic solvent soluble layer while leaving the layers underneath the organic solvent soluble layer unremoved.

FIG. 1 is a flow chart illustrating a method of reworking an ARC layer on a substrate according to one embodiment of the present invention.

In Step 100, a substrate having a material layer is provided. The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The material layer may be an organic dielectric, a metal, a ceramic, or a semiconductor. Preferably, the material layer is an organic dielectric layer (ODL).

In Step 110, a planarization layer is formed on the material layer. Preferably, the planarization layer is an organic planarization layer (OPL). Examples of OPL suitable for the present invention include, but are not limited to, CHM701B, commercially available from Cheil Chemical Co., Ltd., HM8006 and HM8014, commercially available from JSR Corporation, and ODL-102, commercially available from ShinEtsu Chemical, Co., Ltd.

In Step 120, an organic solvent soluble layer is formed on the planarization layer. The organic soluble layer is a polymer or a mixture of polymers soluble in organic solvents. Examples of polymers suitable for the present invention include, but are not limited to, polysulfone, polyarylsulfone, polyethersulfone, polyimide, and polyarylether. Preferably, the organic solvent soluble layer is polyarylsulfone. One example of polyarylsulfone that may be used within the context of the present invention is UDEL™, commercially available from Amoco Corporation.

The organic soluble layer may also comprise a dye which provides the organic soluble layer with desired optical properties for improved anti-reflective effects. Preferably, the organic soluble layer has a refractive index (n) in the range from about 1.4 to about 2.0 and an absorption parameter (k) in the range from about 0.1 to about 0.6 at the imaging wavelength used to create the resist pattern. More preferably, the organic soluble layer has a refractive index (n) in the range from about 1.6 to about 1.8 and an absorption parameter (k) in the range from about 0.2 to about 0.5 at the imaging wavelength used to create the resist pattern.

In Step 130, an ARC layer is formed on the organic solvent soluble layer. The ARC layer may suitably be any ARC conventionally used in processes involving photoresists. Preferably, the ARC layer is a silicon ARC (SiARC) layer.

In Step 140, a pattern is formed in the ARC layer. The ARC pattern may be formed by using a photoresist layer with a resist pattern as a mask. The resist pattern may be transferred to the ARC layer by an etch transfer process.

If a substrate has a failed ARC pattern, then the ARC layer is removed in Step 150. A failed ARC pattern means, for example, an ARC pattern whose size is out of spec, or an ARC pattern in which a pattern deviation is generated.

In Step 150, an organic solvent is used to remove the organic solvent soluble layer and the overlying ARC layer from the substrate. The organic solvent dissolves the organic solvent soluble layer and releases the ARC layer on top of the organic solvent soluble layer. Examples of organic solvents suitable for the present invention may include, but are not limited to, cyclopentanone, cyclohexanone, γ-butyrolactone, N-methyl-2-pyrrolidone (NMP), and a mixture of γ-butyrolactone (GBL) and N-butyl acetate (NBA) such as VT7000 (70% of GBL and 30% of NBA), commercially available from General Chemical West, or QZ 3501 (70% of GBL and 30% of NBA), commercially available from Fujifilm Electronic Materials. Above solvents may be used alone or in admixture. The organic solvent does not dissolve the planarization layer. Therefore, the planarization layer and the layers below the planarization layer remain unremoved.

Figure 2:
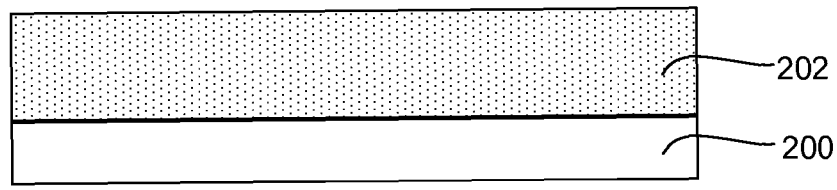
FIGS. 2-28 are cross-sectional views that illustrate exemplary processing steps of a method of reworking an ARC layer on a substrate, in accordance with embodiments of the present invention.

FIGS. 2-11 are cross-sectional views illustrating exemplary processing steps in accordance with embodiments of the present invention. In FIG. 2, a substrate 200 with a material layer 202 on top of the substrate is provided, such as described in Step 100 above. The material layer 202 is preferably an ODL. The ODL preferably has a thickness in the range from about 50 nm to about 500 nm, more preferably, from about 100 nm to about 250 nm.

Figure 3:
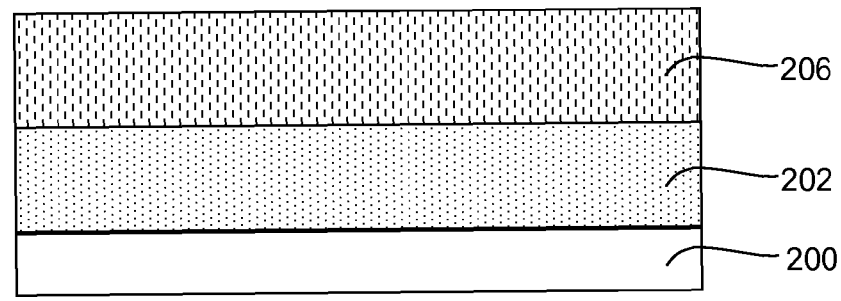

In FIG. 3, a planarization layer 206 is formed on the material layer 202, such as described in Step 110 above. The planarization layer 206 preferably has a thickness in the range from about 20 nm to about 500 nm, more preferably, from about 100 nm to about 300 nm.

Figure 4A:
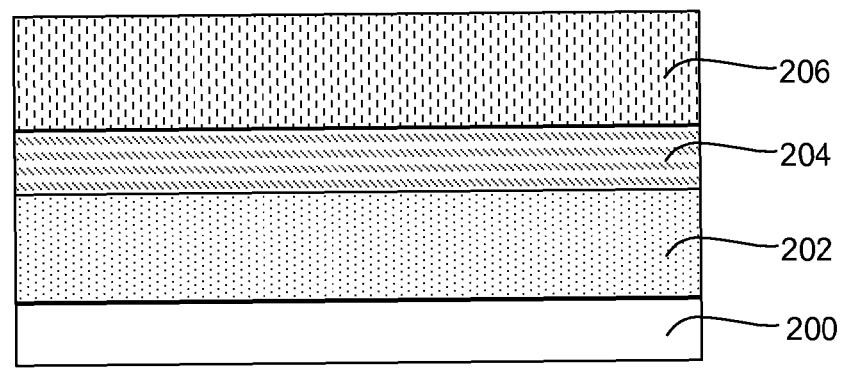
Figure 4B:
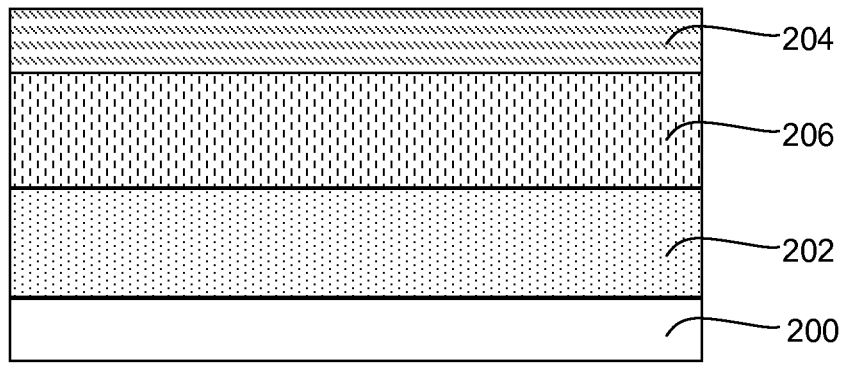

The present invention may also include forming a hardmask layer 204 either before or after the planarization layer 206 is formed. If the hardmask layer 204 is formed before the formation of the planarization layer 206, then the hardmask layer 204 is between the material layer 202 and the planarization layer 206 (FIG. 4A). If the hardmask layer 204 is formed after the formation of the planarization layer 206, then the hardmask layer 204 is above the planarization layer 206 (FIG. 4B).

The hardmask layer 204 may be any material that generally serves the function of a hardmask layer, i.e., provides a differential etch barrier to maintain an image defined during the initial processing until the finial processing is complete. Examples of materials suitable for the hardmask layer 204 include, but are not limited to, silicon dioxide, spin-on glass, tetraethyl orthosilicate (TEOS), silicon nitride, and metal nitrides such as titanium nitride and tantalum nitride. The hardmask layer preferably has a thickness in the range from about 10 nm to about 100 nm, more preferably, from about 10 nm to about 50 nm.

Figure 5:
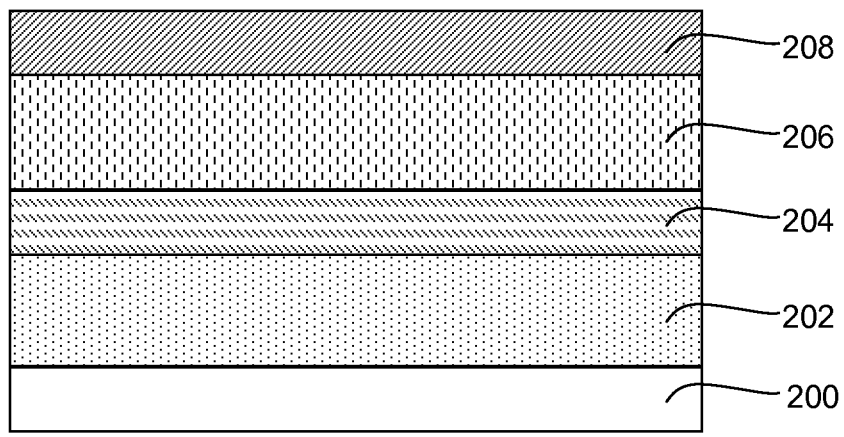

In FIG. 5, an organic solvent soluble layer 208 is formed on the planarization layer 206, such as described in Step 120 above. The organic soluble layer may be formed by any standard means for forming a coating including spin coating. The organic soluble layer may be baked to remove any solvent from the organic soluble layer and improve the coherence of the organic soluble layer. The preferred range of the bake temperature for the organic soluble layer is from about 100° C. to about 250° C., more preferably from about 150° C. to about 200° C. The preferred range of thickness of the organic soluble layer is from about 10 nm to about 200 nm, more preferably from about 20 nm to about 100 nm.

Figure 6:
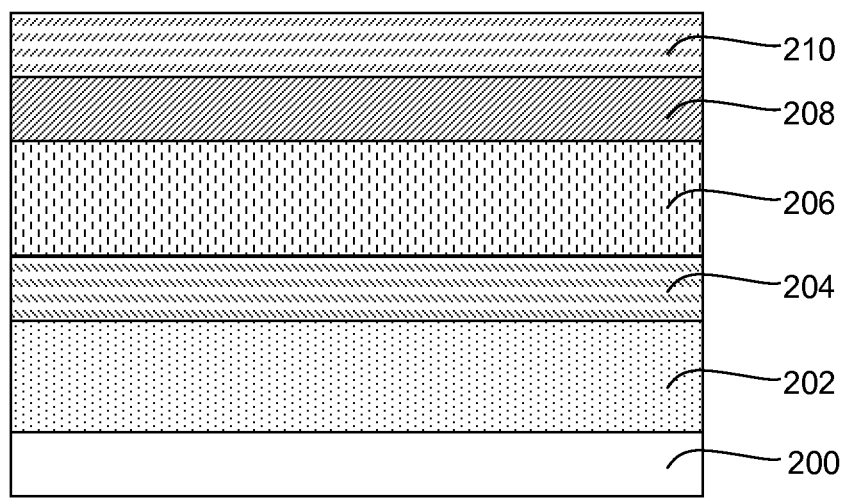

In FIG. 6, an ARC layer 210 is formed on the organic solvent soluble layer 208, such as described in Step 130 above. The ARC layer 210 is preferably a silicon-containing ARC layer. The ARC layer 210 may be formed by any standard means for forming a coating including spin coating an ARC layer solution. It is preferred that the solvent of the ARC layer solution does not dissolve the underlying organic solvent soluble layer 208. The ARC layer 210 may be baked to remove any solvent from the ARC layer and cause the polymer in the ARC layer to crosslink. The preferred range of the bake temperature for the ARC layer is from about 100° C. to about 250° C., more preferably from about 150° C. to about 200° C. The ARC layer preferably has a thickness in the range from about 20 nm to about 150 nm, more preferably, from about 25 nm to about 80 nm.

Figure 7:
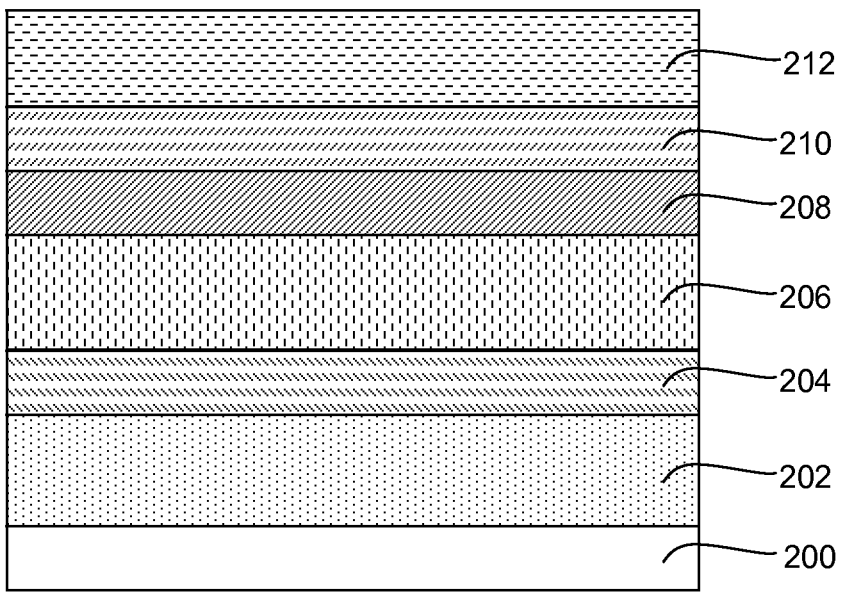

In FIG. 7, a photoresist layer 212 is formed on the ARC layer 210. The photoresist may be any photoresist conventionally used in semiconductor industry, including 193 nm and 248 nm photoresists. Both positive-tone resists and negative-tone resists are suitable to be used in the present invention. The photoresist layer 212 may be formed by virtually any standard means including spin coating. The photoresist layer 212 may be baked (post applying bake (PAB)) to remove any solvent from the photoresist and improve the coherence of the photoresist layer. The preferred range of the PAB temperature for the photoresist layer 212 is from about 70° C. to about 150° C., more preferably from about 90° C. to about 130° C. The preferred range of thickness of the photoresist layer 212 is from about 20 nm to about 400 nm, more preferably from about 50 nm to about 300 nm.

Figure 8:
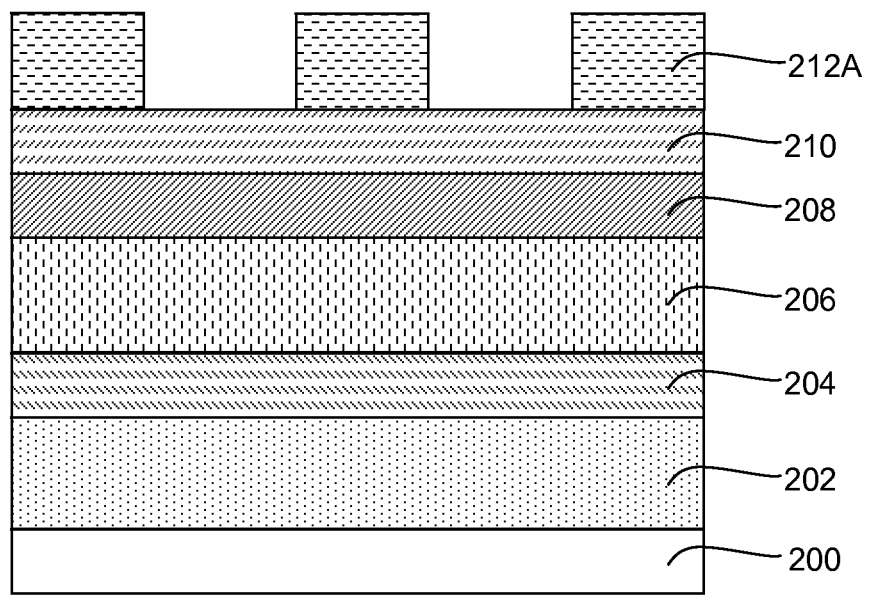

In FIG. 8, a resist pattern 212A is formed in the photoresist layer 212. The resist pattern may be formed by exposing the photoresist layer 212 to a radiation having an imaging wavelength. The radiation employed in the present invention can be visible light, ultraviolet (UV), extreme ultraviolet (EUV) and electron beam (E-beam). It is preferred that the imaging wavelength of the radiation is about 365 nm, 248 nm, 193 nm or 13 nm. More preferably, the imaging wavelength of the radiation is about 193 nm.

After exposure, the photoresist layer 212 is developed in an aqueous base solution to form a resist pattern 212A in the photoresist layer 212. It is preferred that the aqueous base solution is tetramethylammonium hydroxide (TMAH) solutions. It is further preferred that the concentration of the TMAH solutions is about 0.263 N. The aqueous base solution may further comprise additives, such as surfactants, polymers, isopropanol, ethanol, etc.

A post exposure bake (PEB) step may be performed after the photoresist layer 212 is exposed with the radiation and before it is developed. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

Figure 9A:
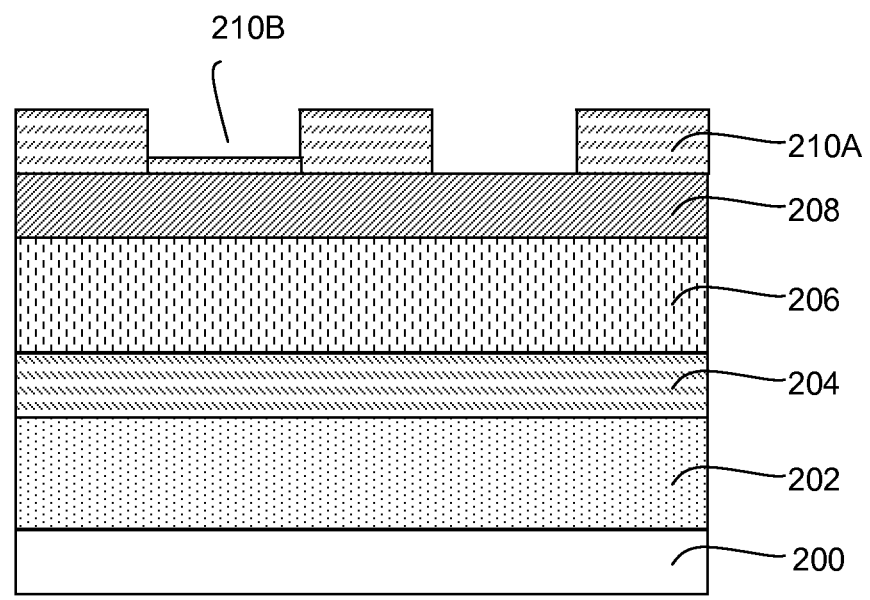
Figure 9B:
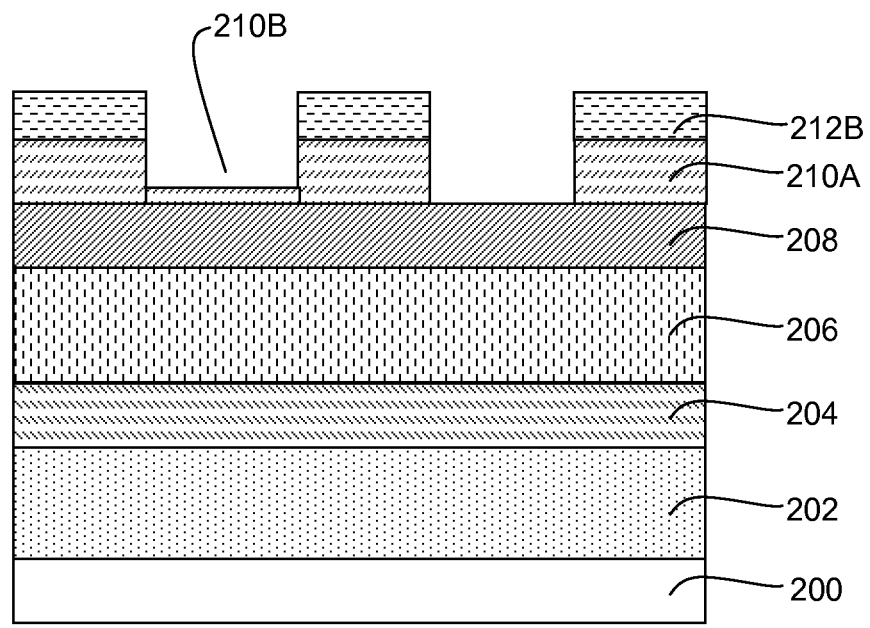

In FIGS. 9A and 9B, the resist pattern 212A is transferred into the ARC layer 210 by removing portions of the ARC layer 210 not covered by the patterned photoresist layer 212. Typically, portions of the ARC layer are removed by reactive ion etching or some other technique known to one skilled in the art.

In one embodiment of the present invention, the photoresist layer 212 may be completely consumed in the etch transfer process (FIG. 9A). In another embodiment, there may be still remaining resist layer 212B after the etch transfer process (FIG. 9B). In either case, the ARC pattern formed by the above-mentioned method may have defects due to conditions of the etch transfer process and exterior variables. For example, a residual ARC material may remain at the bottom of a trench 210B in the ARC layer (FIGS. 9A and 9B). When this happens, the ARC layer 210 needs to be removed from the substrate 200.

Figure 10:
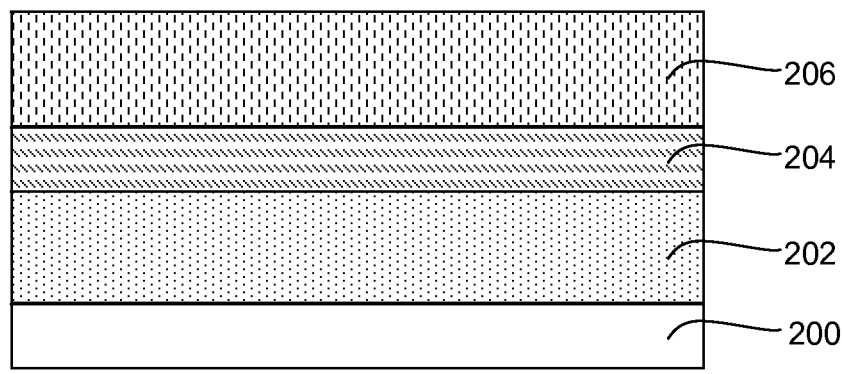

The ARC layer 210 may be substantially removed by using an organic solvent to dissolve the organic solvent soluble layer 208 thereby releasing the overlying ARC layer 210 (FIG. 10). The organic solvent does not dissolve the underlying planarization layer 206. Thus, the planarization layer 206, the hardmask layer 204, and the material layer 202 remain unremoved.

The removal of the organic solvent soluble layer 208 and the overlying ARC layer 210 may be accomplished by contacting the substrate 200 with an organic solvent for a period ranging from 30 seconds to 120 seconds or by dispensing an organic solvent on the substrate 200 and then allowing the fluid to spread evenly by centrifugal force. Additionally, the organic solvent soluble layer 208 may be removed by a wet strip program recipe which provides for a solvent soak of the substrate surface followed by a rapid spin. The solvent soak may be performed by dispensing an organic solvent on the surface of the substrate 200. In this process, the substrate 200 may be slowly rotated to ensure the entire surface is covered by the solvent and to refresh the solvent layer on the substrate with additional fresh solvent. A typical soak time with the dispensing process is from about 30 seconds to about 60 seconds. A typical rotation rate is below 200 rpm and more preferably below 50 rpm. For a challenging material that resists rework, a longer soak time may be performed by immersing the substrate in an organic solvent. In some cases when the solvent soak process is a batch process rather than a single wafer process, a soak time of about 60 minutes may be needed to remove the organic solvent soluble layer 208.

Optionally, a dry strip process may be performed before the wet strip process, i.e., removing the organic solvent soluble layer 208 and the overlying layers with an organic solvent. The dry strip process can facilitate the wet strip process by increasing solvent penetration into the organic solvent soluble layer 208 in the wet strip process. Preferably, the dry strip process is performed under a mild condition such that no significant plasma hardening of the organic soluble layer 208 occurs during the dry strip process. In one preferred embodiment, the remaining photoresist layer 212 and about 50 Å of the ARC layer 210 are removed during the dry strip process. Suitable dry strip processes include, but are not limited to, an ashing process using a downstream ashing tool and an etch process using a regular etch chamber such as a Dual Frequency Capacitive Coupled (DFC) or an Inductively Coupled (ICP) platform available from such vendors as AMAT, Lam Research, or TEL. In both instances, etch gases such as $N_2$, $H_2$, $CF_4$, $CO_2$, CO, and $O_2$ can be used in various combinations to achieve the mild strip condition goal.

The dry strip process can be performed in a wide range of pressure and power settings depending on the dry strip tool of choice. For example, when a DFC plasma etch chamber is used, it is preferred that the pressure setting is from about 30 mTorr to about 150 mTorr, the source power setting is from about 100 W to about 500 W, and the reflective (bottom) power setting is from about 0 W to about 300 W.

Still optionally, a second dry strip process may be employed after the wet strip process as a clean up to remove any remnant photoresist layer 212, ARC layer 210 and organic solvent soluble layer 208 and as a surface preparation for the subsequent reapplication of different layers. Preferably, the second dry strip process is performed under a mild condition such that no significant thickness loss of the underlying planarization layer 206 occurs and no significant undesirable plasma defects is formed in the planarization layer 206 during the second dry strip process. In one preferred embodiment, any remnant resist layer 212, ARC layer 210 and organic solvent soluble layer 208, as well as about 50 Å of the planarization layer 206 are removed during the dry strip process. Suitable dry strip processes include, but are not limited to, an ashing process using a downstream ashing tool and an etch process using a regular etch chamber such as a Dual Frequency Capacitive Coupled (DFC) or an Inductively Coupled (ICP) platform available from such vendors as AMAT, Lam Research, or TEL. In both instances, etch gases such as $N_2$, $H_2$, $CF_4$, $CO_2$, CO, and $O_2$ can be used in various combinations to achieve the mild strip condition goal.

The second dry strip process can be performed in a wide range of pressure and power settings depending on the dry strip tool of choice. For example, when a DFC plasma etch chamber is used, it is preferred that the pressure setting is from about 30 mTorr to about 150 mTorr, the source power setting is from about 100 W to about 500 W, and the reflective (bottom) power setting is from about 0 W to about 300 W.

Figure 11:
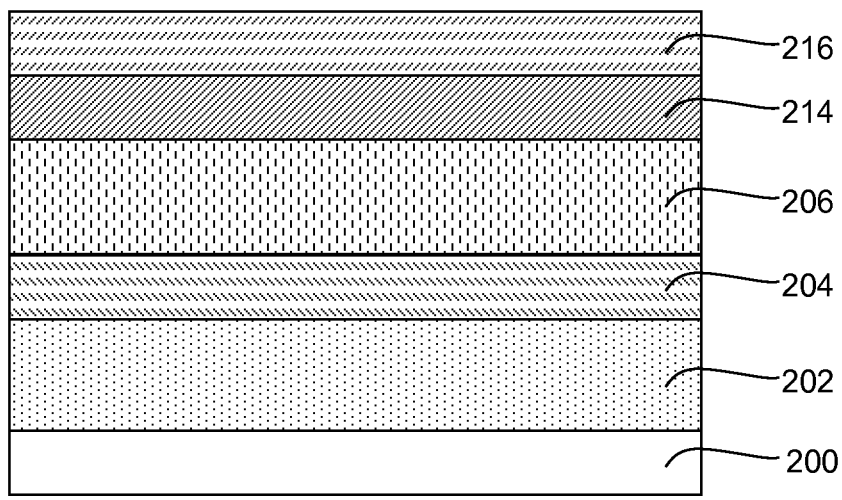

After the defected ARC layer 210 is removed, a second organic solvent soluble layer 214 is formed on the planarization layer 206 followed by the formation of a second ARC layer 216 on the second organic solvent soluble layer 214 (FIG. 11). The second organic solvent soluble layer 214 may be the same material as or a different material from the first organic solvent soluble layer 208. Examples of polymers suitable for the second organic solvent soluble layer 214 include, but are not limited to, polysulfone, polyarylsulfone, polyethersulfone, polyimide, and polyarylether. Preferably, the second organic solvent soluble layer 214 is polyarylsulfone. The second organic solvent soluble layer 214 may also comprise a dye which provides the second organic solvent soluble layer 214 with desired optical properties for improved anti-reflective effects. The second organic solvent soluble layer 214 may be formed by any standard means for forming a coating including spin coating. The second organic solvent soluble layer 214 may be baked to remove any solvent from the second organic solvent soluble layer 214 and improve the coherence of the second organic solvent soluble layer 214.

The second ARC layer 216 may be the same ARC material as or a different ARC material from the first ARC layer 210. The second ARC layer 216 is preferably a SiARC layer. The second ARC layer 216 may be formed by any standard means for forming a coating including spin coating an ARC layer solution. The ARC layer 216 may be baked to remove any solvent from the second ARC layer 216 and cause the polymer in the second ARC layer to crosslink. The preferred range of the bake temperature for the second ARC layer 216 is from about 100° C. to about 250° C., more preferably from about 150° C. to about 200° C. The second ARC layer 216 preferably has a thickness in the range from about 20 nm to about 150 nm, more preferably, from about 25 nm to about 80 nm.

Figure 12:
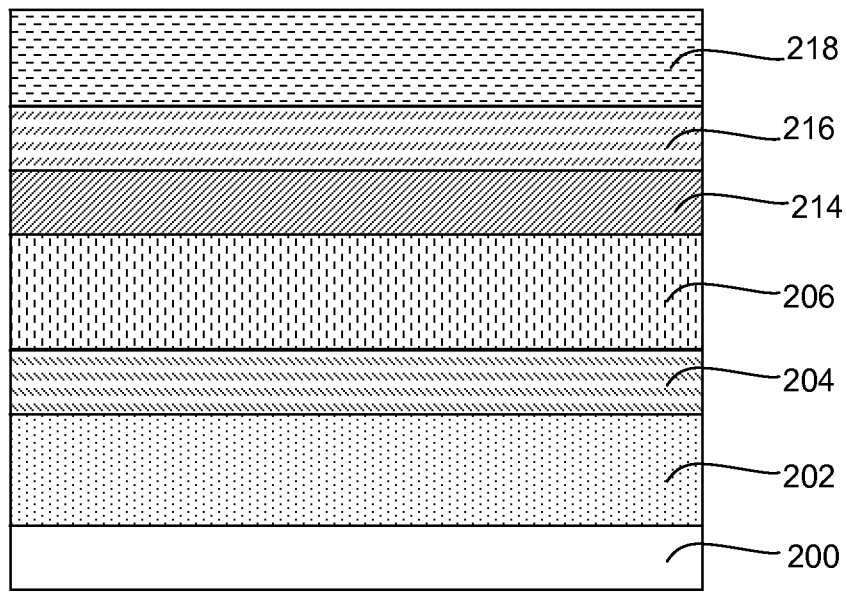

A second photoresist layer 218 is then formed on the second ARC layer 216 (FIG. 12). The second photoresist layer 218 may be the same photoresist as or a different photoresist from the first photoresist layer 212. The photoresist may be any photoresist conventionally used in semiconductor industry, including 193 nm and 248 nm photoresists. Both positive-tone resists and negative-tone resists are suitable to be used in the present invention. The second photoresist layer 218 may be formed by virtually any standard means including spin coating. The second photoresist layer 218 may be baked (PAB) to remove any solvent from the photoresist and improve the coherence of the photoresist layer. The preferred range of the PAB temperature for the second photoresist layer 218 is from about 70° C. to about 150° C., more preferably from about 90° C. to about 130° C. The preferred range of thickness of the second photoresist layer 218 is from about 20 nm to about 400 nm, more preferably from about 50 nm to about 300 nm.

Figure 13:
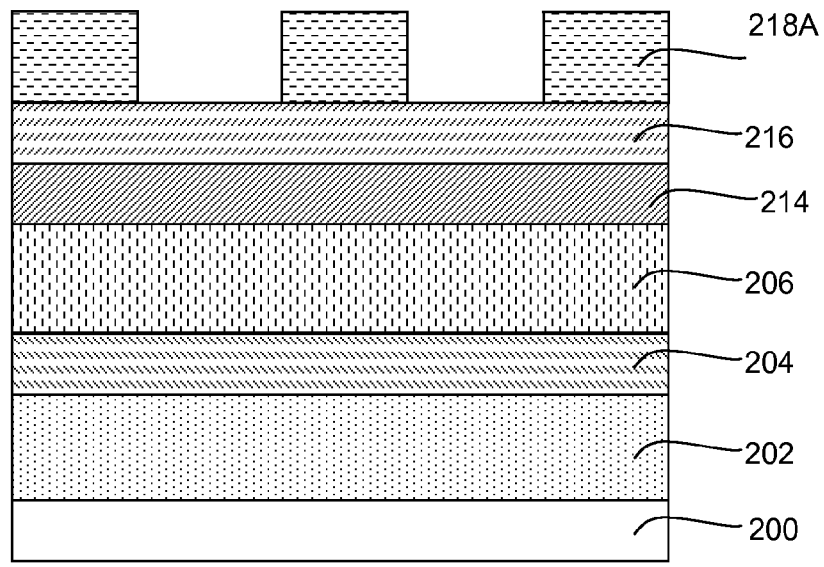

In FIG. 13, a resist pattern 218A is formed in the second photoresist layer 218. The resist pattern may be formed by exposing the second photoresist layer 218 to a radiation having an imaging wavelength. The radiation employed in the present invention can be visible light, ultraviolet (UV), extreme ultraviolet (EUV) and electron beam (E-beam). It is preferred that the imaging wavelength of the radiation is about 365 nm, 248 nm, 193 nm or 13 nm. It is more preferred that the imaging wavelength of the radiation is about 193 nm.

After exposure, the second photoresist layer 218 is developed in an aqueous base solution to form the resist pattern 218A in the second photoresist layer 218. It is preferred that the aqueous base solution is tetramethylammonium hydroxide (TMAH) solutions. It is further preferred that the concentration of the TMAH solutions is about 0.263 N. The aqueous base solution may further comprise additives, such as surfactants, polymers, isopropanol, ethanol, etc.

A PEB step may be performed after the second photoresist layer 218 is exposed with the radiation and before it is developed. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

Figure 14:
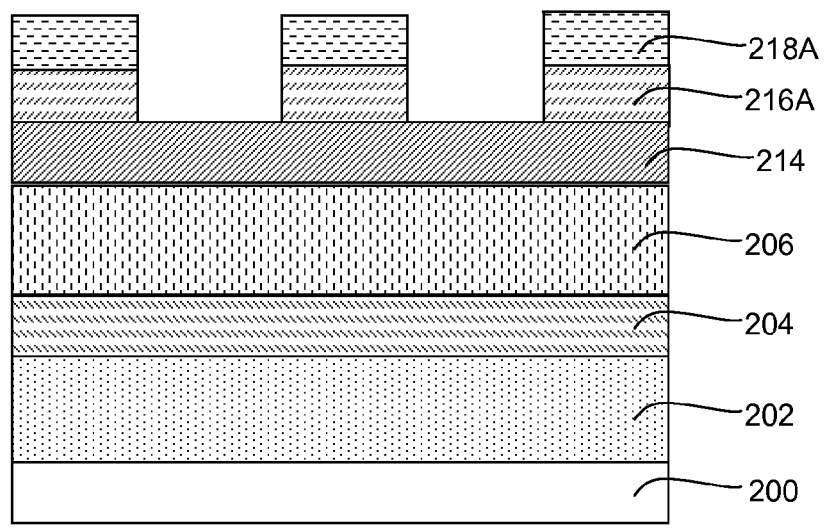

In FIG. 14, the resist pattern 218A is transferred into the second ARC layer 216 by removing portions of the ARC layer 216 not covered by the patterned second photoresist layer 218. Typically, portions of the second ARC layer 216 are removed by reactive ion etching or some other technique known to one skilled in the art. In one embodiment of the present invention, the resist layer 218 may be completely consumed in the etch transfer process. In another embodiment, there may be still remaining resist layer 218B after the etch transfer process (FIG. 14).

If the ARC pattern 216A formed by the above-mentioned method contains defects again, the steps illustrated in FIGS. 10-14 may be repeated in order to form a defect-free ARC pattern.

Figure 15:
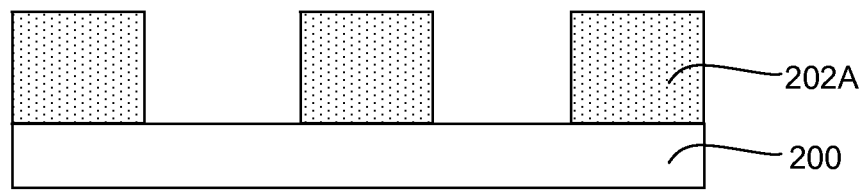

The ARC pattern 216A can be further transferred sequentially to the underlying layers and eventually to the material layer 202 by removing portions of the underlying layers not covered by the patterned second ARC layer 216 (FIG. 15). Typically, the pattern transfer is established by reactive ion etching or some other technique known to one skilled in the art.

Alternatively, the organic solvent soluble layer 208 may be formed under the planarization layer 206. In this case, both of the ARC layer 210 and the planarization layer 206 may be removed by dissolving the underlying organic solvent soluble layer 208 in an organic solvent.

Figure 16:
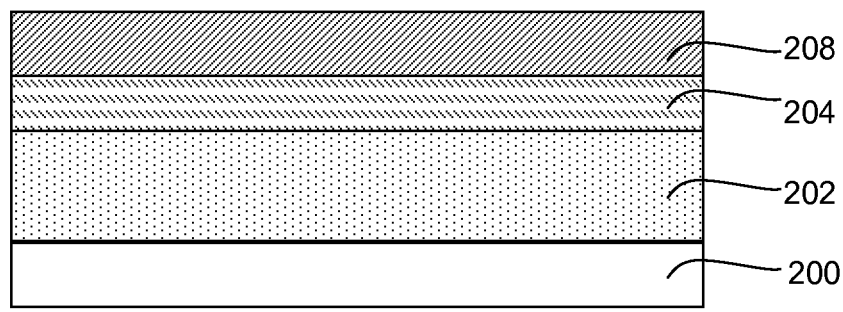
Figure 17:
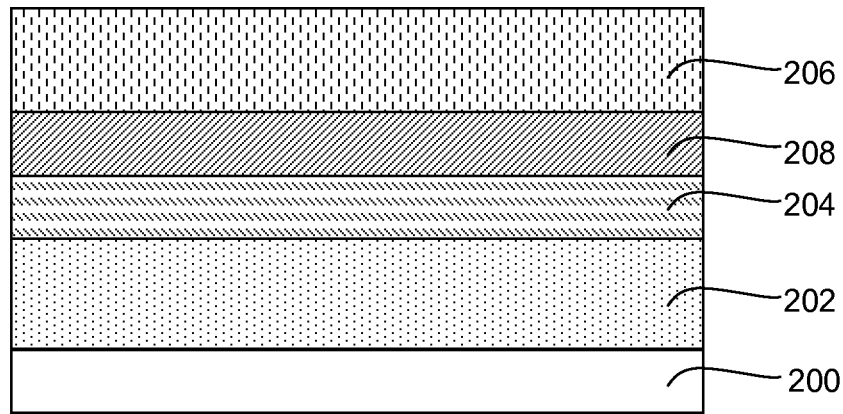

Referring to FIGS. 16-28, the organic solvent soluble layer 208 is formed on a substrate 200 having a material layer 202 and a hardmask layer 204 (FIG. 16). The planarization layer 206 is then formed on the organic solvent soluble layer 208 (FIG. 17). It is preferred that the solvent of the planarization layer solution does not dissolve the underlying organic solvent soluble layer 208. The organic solvent soluble layer 208 and the planarization layer 206 are formed the same way as previously described.

Figure 18:
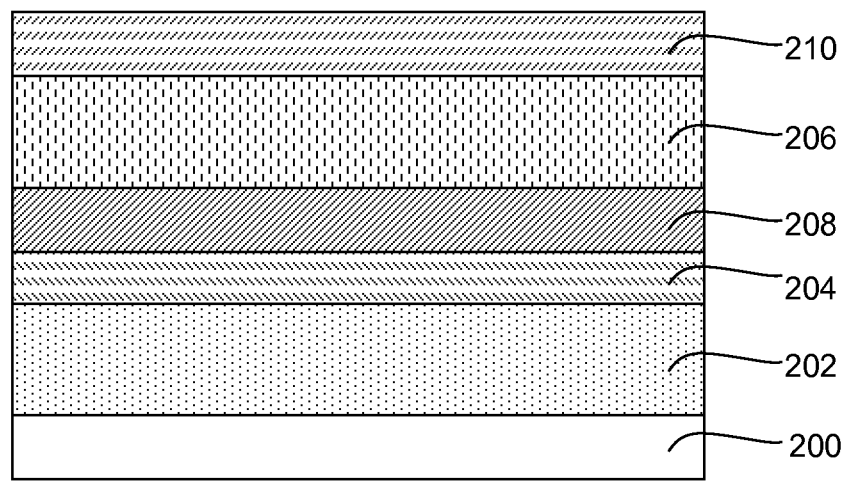
Figure 19:
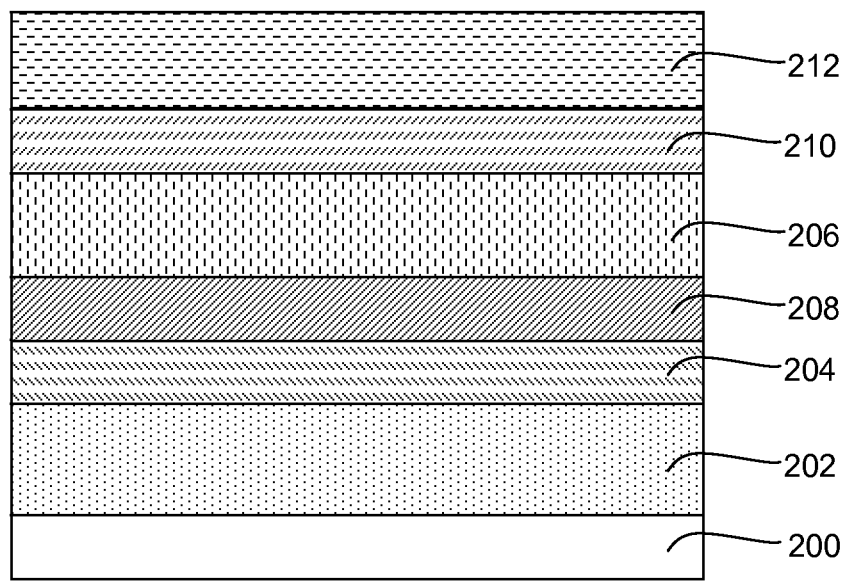

The ARC layer 210 is formed on the planarization layer 206 (FIG. 18). The photoresist layer 212 is then formed on the ARC layer 210 (FIG. 19). The ARC layer 210 and the photoresist layer 212 are formed the same way as previously described.

Figure 20:
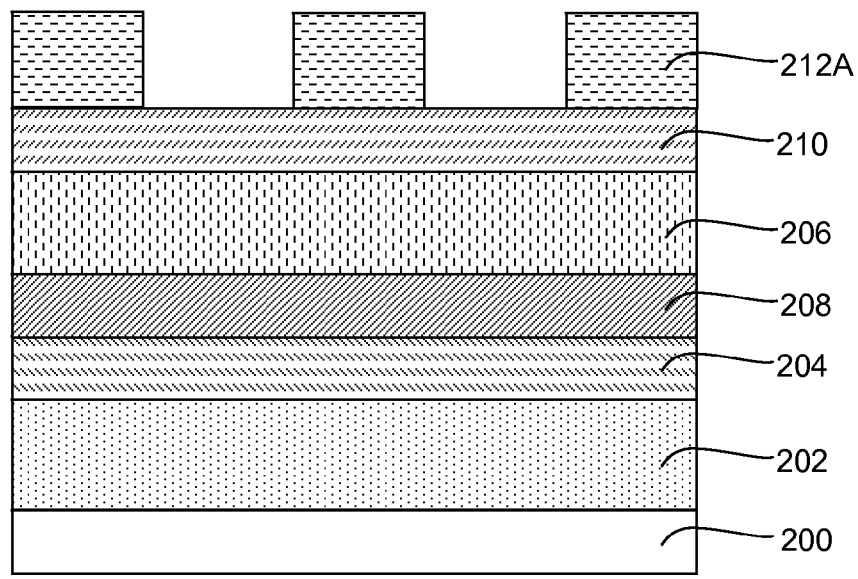
Figure 21:
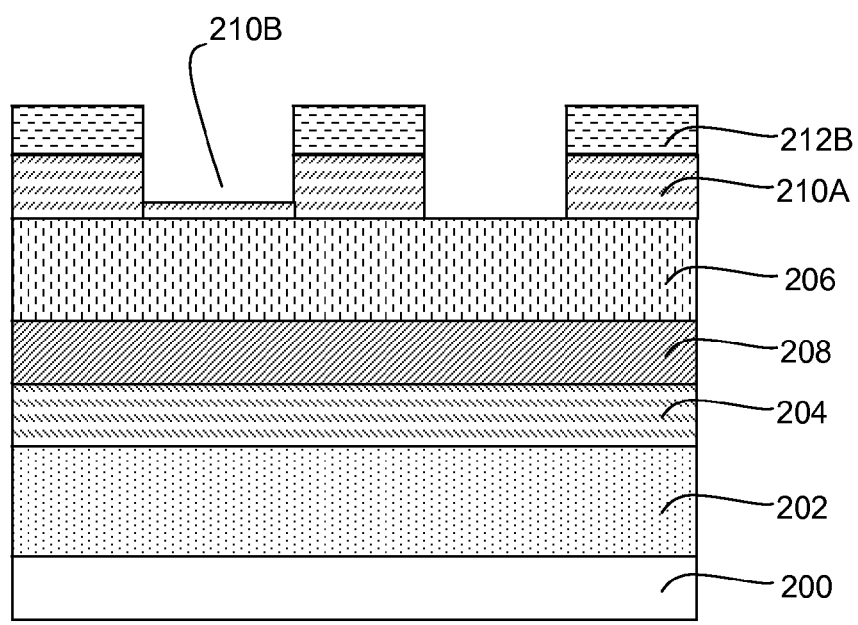

In FIG. 20, the photoresist layer 212 is exposed to form a resist pattern 212A, the same way as previously described. In FIG. 21, the resist pattern 212A is transferred to the ARC layer 210 to form an ARC pattern 210A preferably through an etch transfer process. In one embodiment of the present invention, the resist layer 212 may be completely consumed in the etch transfer process. In another embodiment, there may be still remaining resist layer 212B after the etch transfer process (FIG. 21). As shown in FIG. 21, the ARC pattern formed may contain defects such as a residual ARC material at the bottom of a trench 210B in the ARC layer.

Figure 22:
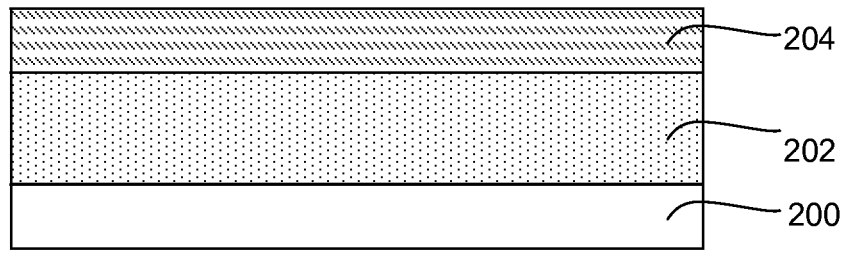

The remaining resist layer 212 and ARC layer 210 as well as the planarization layer 208 may be substantially removed by using an organic solvent to dissolve the organic solvent soluble layer 208 thereby releasing the overlying resist layer 212, ARC layer 210 and planarization layer 208 (FIG. 22). The organic solvent does not dissolve the underlying hardmask layer 204. Thus, the hardmask layer 204 and the material layer 202 remain unremoved.

As described above, the removal of the organic solvent soluble layer 208 and the overlying resist layer 212, ARC layer 210 and planarization layer 208 may be accomplished by contacting the substrate 200 with an organic solvent for a period ranging from 30 seconds to 120 seconds or by dispensing an organic solvent on the substrate 200 and then allowing the fluid to spread evenly by centrifugal force. Additionally, the organic solvent soluble layer 208 may be removed by a wet strip program recipe which provides for a solvent soak of the substrate surface followed by a rapid spin. The solvent soak may be performed by dispensing an organic solvent on the surface of the substrate 200. In this process, the substrate 200 may be slowly rotated to ensure the entire surface is covered by the solvent and to refresh the solvent layer on the substrate with additional fresh solvent. A typical soak time with the dispensing process is from about 30 seconds to about 60 seconds. A typical rotation rate is below 200 rpm and more preferably below 50 rpm. For a challenging material that resists rework, a longer soak time may be performed by immersing the substrate in an organic solvent. In some cases when the solvent soak process is a batch process rather than a single wafer process, a soak time of about 60 minutes may be needed to remove the organic solvent soluble layer 208.

Optionally, a dry strip process may be performed before the wet strip process, i.e., removing the organic solvent soluble layer 208 with an organic solvent. Still optionally, a second dry strip process may be employed after the wet strip process as a clean up to remove any remnant resist layer 212, ARC layer 210, planarization layer 206 and organic solvent soluble layer 208 and as a surface preparation for the subsequent reapplication of different layers.

Figure 23:
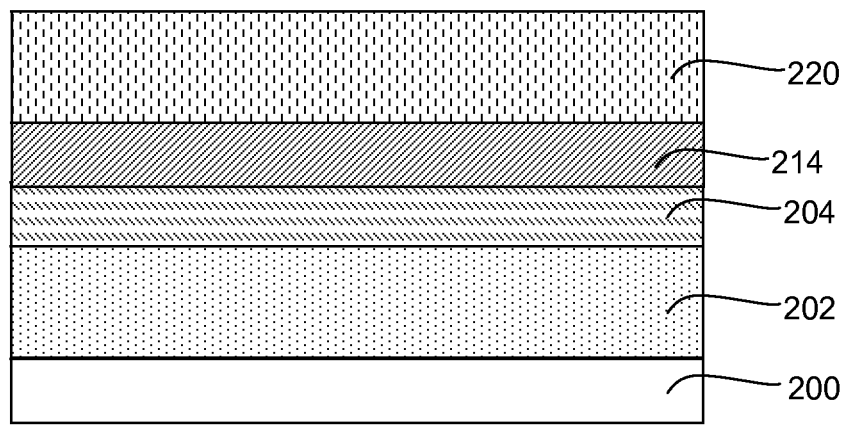

After the defected ARC layer 210 and the planarization layer 208 are removed, a second organic solvent soluble layer 214 is formed on the hardmask layer 204 followed by the formation of a second planarization layer 220 on the second organic solvent soluble layer 214 (FIG. 23). The second organic solvent soluble layer 214 is formed the same way as previously described. The second planarization layer 220 may be the same planarization material as or a different planarization material from the first planarization layer 206.

Figure 24:
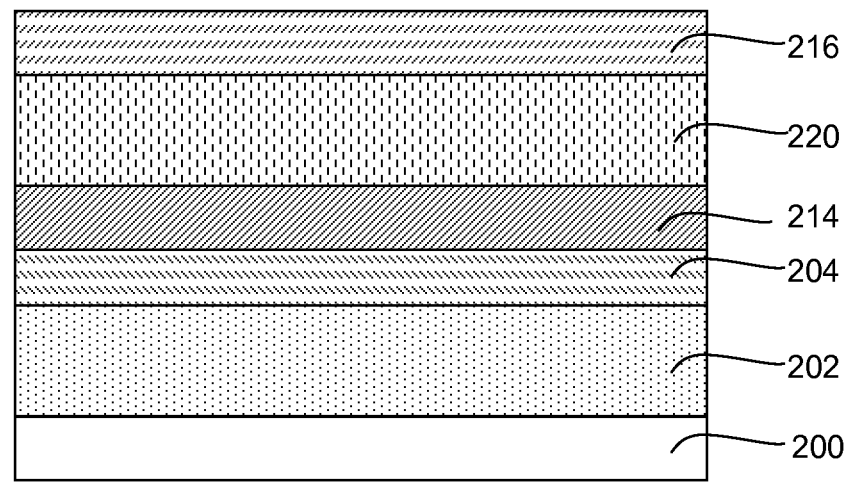
Figure 25:
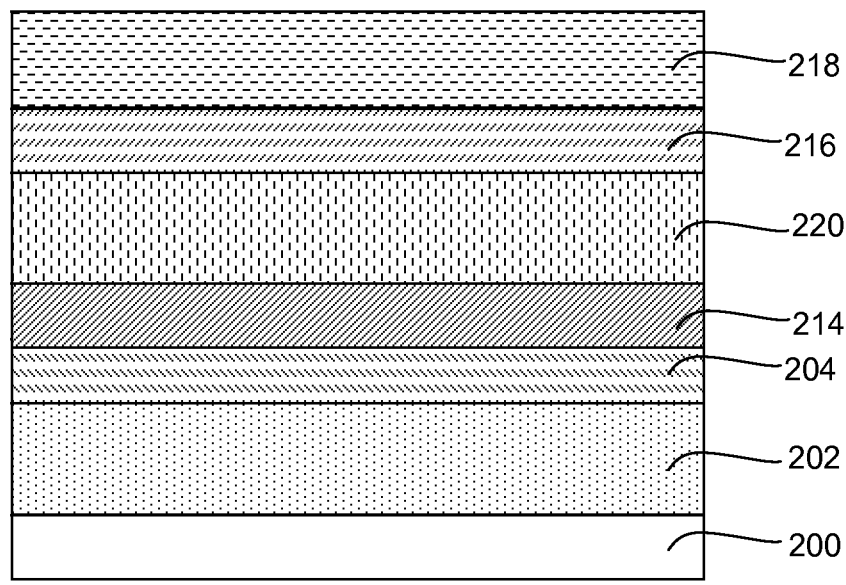

The second ARC layer 216 is then formed on the second planarization layer 220, followed by the formation of the second photoresist layer 218 on the second ARC layer 216 (FIGS. 24-25). The second ARC layer 216 and the second photoresist layer 218 are formed the same way as previously described.

Figure 26:
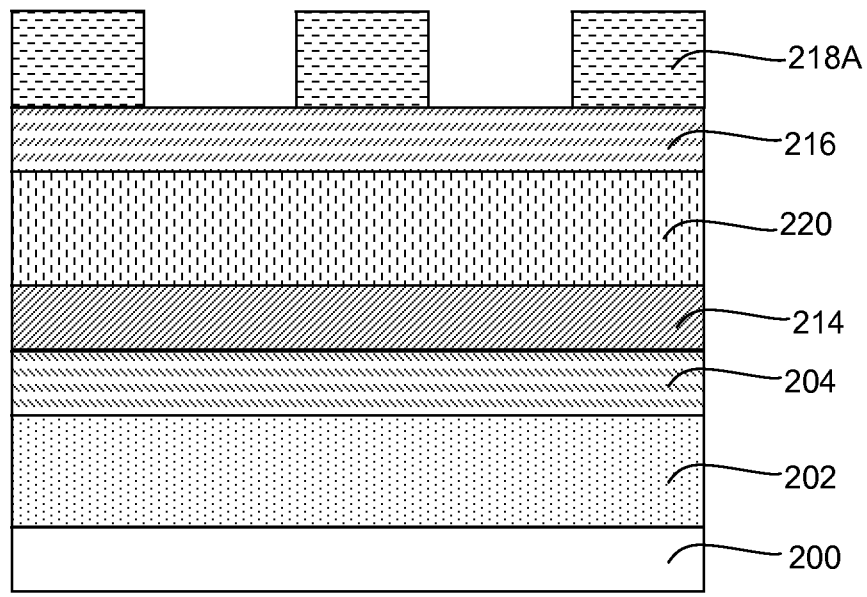
Figure 27:
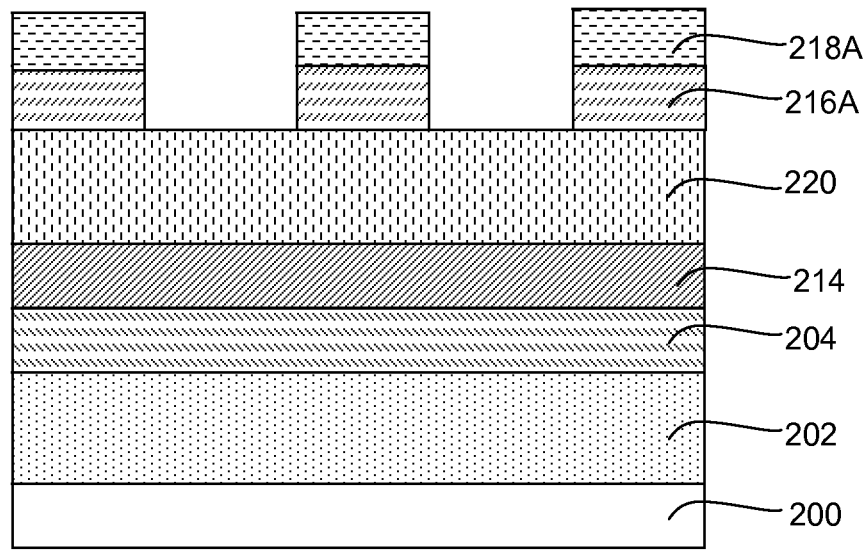

In FIG. 26, the second photoresist layer 218 is exposed to form a resist pattern 218A. The resist pattern 218A is then transferred to the second ARC layer 216 to form an ARC pattern 216A, preferably through an etch transfer process (FIG. 27).

If the ARC pattern 216A formed by the above-mentioned method contains defects again, the steps illustrated in FIGS. 22-27 may be repeated in order to form a defect-free ARC pattern.

Figure 28:
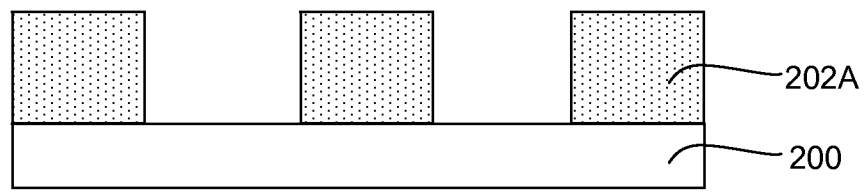

The ARC pattern 216A can be further transferred sequentially to the underlying layers and eventually to the material layer 202 by removing portions of the underlying layers not covered by the patterned second ARC layer 216 (FIG. 28). Typically, the pattern transfer is established by reactive ion etching or some other technique known to one skilled in the art.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method of reworking an antireflective coating (ARC) layer, comprising the steps of:
   providing a substrate having a material layer;
   forming a planarization layer on the material layer;
   forming an organic solvent soluble layer on the planarization layer;
   forming an ARC layer on the organic solvent soluble layer;
   forming a pattern in the ARC layer; and
   removing the organic solvent soluble layer and the patterned ARC layer together with an organic solvent while leaving the planarization layer unremoved, wherein the organic solvent soluble layer remains fully soluble after the patterning of the ARC layer, and wherein the organic solvent completely removes the organic solvent soluble layer and the ARC layer.

2. The method of claim 1, further comprising:
after providing the substrate and before forming the planarization layer, forming a hardmask layer on the material layer, wherein the hardmask layer is between the material layer and the planarization layer.

3. The method of claim 1, further comprising:
after forming the planarization layer and before forming the organic solvent soluble layer, forming a hardmask layer on the planarization layer, wherein the hardmask layer is between the planarization layer and the organic solvent soluble layer.

4. The method of claim 1, wherein the material layer is an organic dielectric, a metal, a ceramic, or a semiconductor.

5. The method of claim 1, wherein the ARC layer is a silicon ARC layer.

6. The method of claim 1, wherein the organic solvent soluble layer comprises polysulfone, polyarylsulfone, polyethersulfone, polyimide, or polyarylether.

7. The method of claim 6, wherein the thickness of the organic solvent soluble layer is in the range from about 20 nm to about 100 nm.

8. The method of claim 1, wherein the organic solvent is selected from the group consisting of cyclopentanone, cyclohexanone, γ-butyrolactone, N-methyl-2-pyrrolidone (NMP), a mixture of γ-butyrolactone (GBL) and N-butyl acetate (NBA), and a combination of two or more of the foregoing solvents.

9. The method of claim 1, wherein forming the pattern on the ARC layer comprises:
forming a photoresist layer on the ARC layer;
forming a resist pattern in the photoresist layer; and
forming a pattern on the ARC layer by using the photoresist layer on which the resist pattern is formed as a mask.

10. The method of claim 9, wherein forming the resist pattern in the photoresist layer comprises exposing the photoresist layer with an imaging radiation.

11. The method of claim 10, wherein the organic solvent soluble layer has a refractive index (n) in the range from about 1.6 to about 1.8 and an absorption parameter (k) in the range from about 0.2 to about 0.5 at the wavelength of the imaging radiation.

* * * * *